United States Patent
Monchiero et al.

(10) Patent No.: US 8,907,462 B2
(45) Date of Patent: Dec. 9, 2014

(54) INTEGRATED CIRCUIT PACKAGE

(75) Inventors: Matteo Monchiero, Palo Alto, CA (US); Jacob B. Leverich, San Mateo, CA (US); Parthasarathy Ranganathan, Fremont, CA (US); Norman Paul Jouppi, Palo Alto, CA (US); Vanish Talwar, Palo Alto, CA (US)

(73) Assignee: Hewlett-Packard Development Company, L. P., Houston, TX (US)

(*) Notice: Subject to any disclaimer, the term of this patent is extended or adjusted under 35 U.S.C. 154(b) by 185 days.

(21) Appl. No.: 12/366,234

(22) Filed: Feb. 5, 2009

(65) Prior Publication Data

US 2010/0194470 A1    Aug. 5, 2010

(51) Int. Cl.
  *H01L 23/06*  (2006.01)
  *H03K 19/00*  (2006.01)
  *H01L 25/065* (2006.01)
  *H01L 25/18*  (2006.01)
  *H01L 23/36*  (2006.01)

(52) U.S. Cl.
  CPC ... H01L 25/0657 (2013.01); *H01L 2224/16145* (2013.01); *H01L 2924/10253* (2013.01); *H01L 2224/73253* (2013.01); *H01L 2224/16225* (2013.01); *H01L 2225/06513* (2013.01); H03K 19/0016 (2013.01); *H01L 2225/06517* (2013.01); *H01L 2225/06541* (2013.01); *H01L 25/18* (2013.01); *H01L 2924/15311* (2013.01); *H01L 2924/13091* (2013.01); *H01L 23/36* (2013.01)
  USPC ............................................. 257/684; 257/685

(58) Field of Classification Search
  USPC ........... 257/678, 684, 685, 701–703; 327/566
  See application file for complete search history.

(56) References Cited

U.S. PATENT DOCUMENTS

| | | | | |
|---|---|---|---|---|
| 5,451,797 | A  * | 9/1995 | Davis et al. | 257/77 |
| 6,580,611 | B1 * | 6/2003 | Vandentop et al. | 361/704 |
| 6,617,681 | B1 * | 9/2003 | Bohr | 257/700 |
| 6,734,540 | B2 * | 5/2004 | Fritz | 257/686 |
| 6,977,519 | B2 | 12/2005 | Bhavnagarwala et al. | |
| 7,034,344 | B2 | 4/2006 | Pavier | |
| 7,080,341 | B2 | 7/2006 | Eisenstadt et al. | |
| 2007/0023878 | A1 | 2/2007 | Burton | |
| 2008/0001655 | A1 | 1/2008 | Pham et al. | |

OTHER PUBLICATIONS

Singhal, Ronak; "Inside Intel Core Microarchitecture (Nahalem)"; Product Release; Aug. 26, 2008; p. 1-25.

* cited by examiner

*Primary Examiner* — Daniel Whalen

(57) ABSTRACT

An integrated circuit package includes a digital logic die disposed on a substrate; and an interposer die stacked vertically with the digital logic die on the substrate. The interposer die includes at least one vertical transistor configured to selectively provide electrical power to a portion of the digital logic die.

5 Claims, 6 Drawing Sheets

INTEGRATED CIRCUIT PACKAGE

BACKGROUND

Growing transistor densities and an ever-increasing demand for digital data have contributed to a general increase in the power consumed by integrated circuits and integrated circuit packages. This trend toward increased power consumption can be costly in terms of both the actual price of electricity expended by the integrated circuits and the price associated with cooling the integrated circuits as heat is generated by operation of the integrated circuits and must be dissipated. Because of this general rise in the power consumption of integrated circuits, research is being performed into improved power management for such integrated circuits, particularly complex integrated circuitry such as processor cores.

Power consumption in integrated circuits can generally be classified into a dynamic component and a static component. Dynamic power consumption refers to the amount of power consumed by an integrated circuit that is dependent on the level of activity of the logic transistors in the circuit. Dynamic power consumption is sometimes managed by regulating the amount of voltage provided to active transistors and/or the frequency with which the transistors are switched during logic operations. Static power consumption refers to the component of power consumption resulting from leakage current conducted by transistors regardless of the activity status of the transistors. Static power consumption can generally be reduced only by cutting off power to the integrated circuit.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
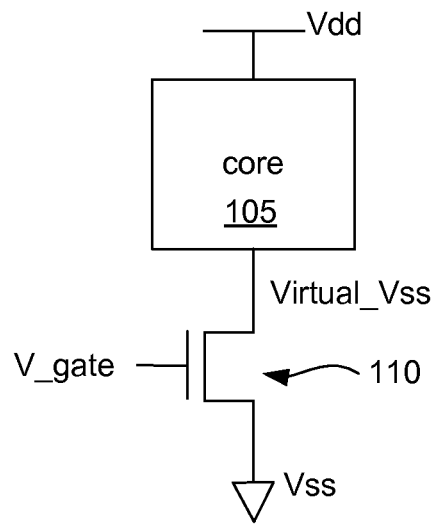
FIG. 1 is a block diagram of an illustrative power-gated processor core integrated circuit, according to one exemplary embodiment of the principles described herein.

In some cases, it may be desirable to optimize the power consumption of an integrated circuit or an electronic system utilizing multiple integrated logic circuits. For example, in a computing system having multiple redundant processing cores, it may not be necessary that all of the processing cores always operate at full processing capacity. Thus, by selectively reducing the power consumption of the processing cores that do not need to remain active, overall power consumption in the computing system may be reduced without appreciable losses in system performance.

One typical approach to optimizing the power consumption of an electronic system utilizing multiple blocks of integrated logic circuitry is to alter the operating voltage and/or frequency at which one or more of the blocks operate in accordance with the dynamic performance requirements of the tasks being performed by the blocks. This method is known as dynamic voltage and frequency scaling (DVFS). However, DVFS and similar schemes do little to combat static power consumption in integrated circuits. Static power consumption has become a more significant contributor to total power consumption in many logic circuits due to the smaller size of many modern transistors. It may, therefore, be desirable to more effectively manage the static component of power consumption in electronic systems employing multiple integrated logic circuits.

Another approach to optimizing the power consumption of an electronic system having multiple integrated logic circuits is that of power gating one or more of the individual integrated logic circuits. Power gating is a technique that allows the power supply to an individual integrated circuit to be selectively shut off by a sleep transistor (also known as a "gate") that is disposed in series with the flow of electrical current from the power source, through the integrated circuit, and to ground or another common node. By selectively enabling the flow of power to an integrated circuit only when that integrated circuit is needed, losses due to static power consumption in the integrated circuit may be reduced.

However, on-chip sleep transistors are conventionally lateral transistors meaning that the sleep transistor is oriented horizontally with respect to the chip, and provides lateral current flow with respect to the chip substrate. Such lateral current flow is inherently more resistive than vertical current flow in transistors. Because of this greater resistivity, on-chip sleep transistors generally consume more power than vertically oriented sleep transistors. Consequentially, it has been discovered that it may be advantageous to incorporate vertical sleep transistors with individual integrated circuits in a system having multiple integrated circuits to reduce static power consumption in the system.

To address the above and other issues, the present specification discloses integrated circuit apparatus, systems, and methods for optimizing power consumption using power gating in a stacked die configuration.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used herein and in the appended claims, the term "vertical transistor" will be defined as a transistor supported on a wafer or circuit board in such a configuration that current flows through the transistor in a direction substantially normal to the supporting substrate. This is opposed to a lateral transistor in which current flows in a direction parallel to the supporting wafer or circuit board.

Consequently, "vertical" or "vertically" will be defined as referring to a direction substantially normal to a supporting substrate.

As used herein and in the appended claims, a "stacked" die configuration refers to a die containing one or more integrated circuits, for example, a digital logic processor, where the die is in a vertical stack with respect to a supporting substrate, the stack also including a second or interposer die containing one or more vertical transistors that act as a power gate for the digital logic die.

As used herein and in the appended claims, the term "digital logic die" will be broadly interpreted to refer to any die incorporating logic transistors including, but not limited to, processor cores, shared cache tiles, encrypt or protocol off-loading engines, memory channels, and/or I/O channels.

The principles disclosed herein will now be discussed with respect to illustrative integrated circuit apparatus, systems, and methods.

Illustrative Integrated Circuits

Referring now to FIG. 1, a block diagram of an illustrative processor core (105) is shown. It will be understood that while the principles of the present specification will be described in the context of managing power consumption in processor cores, these principles may also be applied to any number of electronic system elements using integrated circuits.

The processor core (105) may be implemented on a logic die of an integrated circuit package and may be part of an electronic system incorporating any number of integrated circuits. For example, the processor core (105) may be housed on a printed circuit board (PCB), such as a motherboard, that also houses integrated circuits for additional processor cores (105), memory storage, bus control, peripheral device control, graphics processing, input/output communications, and the like.

A vertical sleep transistor (110) may be incorporated with the processor core (105) such that the sleep transistor (110) is in series with the processor core (105) in the flow of electrical current from a power supply node (Vdd), such as a battery or other DC voltage supply, to a common node (Vss), such as ground. The power supply node (Vdd) and the common node (Vss) may be disposed on the printed circuit board (PCB) that is supporting the processor core (105). A positive voltage differential may be maintained between the power supply node (Vdd) and the common node (Vss) such that the processor core (105) is powered by electrical current flowing from the power supply node (Vdd) to the common node (Vss).

The sleep transistor (110) may be fabricated separately from the processor core (105). In certain embodiments, the sleep transistor (110) may be a vertical n-type metal-oxide-semiconductor field effect transistor (MOSFET). As will be discussed in more detail below, the sleep transistor (110) may be fabricated on a die separate from the die of the processor core (105), and the two dies may be in a stacked arrangement within an integrated circuit package. A stacked configuration and use of a vertical transistor provide substantial benefits and power savings over on-die sleep transistors. For example, vertical transistors inherently consume less power than the lateral orientation of on-die transistors. Furthermore, the stacked arrangement may provide less resistance in the interconnection of the sleep transistor (110) and the processor core (105) while preserving valuable real estate on the PCB that houses the processor core (105) and the sleep transistor (110). Additionally, the use of a MOSFET for the sleep transistor (110), and particularly an n-type MOSFET, may provide significant power savings over a bipolar junction transistor (BJT), for example.

Like other transistors, the sleep transistor (110) may function as a switch—either enabling or preventing the flow of electrical current from a drain node to a source depending on a control voltage (V_gate) present at a gate node. If the control voltage (V_gate) present at the gate node of the sleep transistor (110) is sufficiently high, the sleep transistor (110) may function as a virtual short circuit between the drain node and the source node. Conversely, if the control voltage (V_gate) is below a threshold voltage inherent to the sleep transistor (110), the sleep transistor (110) may function as a virtual open circuit between the drain node and the source node.

In the present example, the drain node of the sleep transistor (110) is electrically coupled to a Virtual_Vss node of the processor core (105). The Virtual_Vss node may be the node in the processor core (105) that would normally be connected to ground or another common node (Vss) when the processor core (105) is active and consuming power. Thus, for the processing core (105) to perform normally and be active, the sleep transistor (110) must maintain a sufficiently high control voltage (V_gate) at the gate node such that a virtual short circuit exists between the Virtual_Vss node of the processing core (105) and the actual ground or common node (Vss) of the PCB supporting the processing core (105) and the sleep transistor (110). Conversely, if it is desired that no power be consumed by the processor core (105), a sufficiently low (preferably at or close to 0V with respect to Vss) control voltage (V_gate) must be maintained at the gate of the sleep transistor (110) such that a virtual open circuit exists between Virtual_Vss and Vss.

To manage and reduce power consumption in the processor core (105), then, power may be selectively cut off from, and provided to, the processor core (105) by selectively altering the control voltage (V_gate) at the gate of the sleep transistor (110). Power may be selectively cut off from and provided to the processor core (105) in accordance with a measured or projected level of activity or idleness of the processor core (105). The control voltage (V_gate) at the gate of the sleep transistor (110) may be provided from at least one of: external power management circuitry, one or more additional processor core(s), and the processor core (105) itself. In certain embodiments, the external power management circuitry and additional processor core(s) may be disposed on the same PCB that supports the processor core (105) and the sleep transistor (110). Additionally, any other source of control voltage may be electrically coupled to the gate of the sleep transistor (110) to manage power consumption of the processor core (105), as may best suit a particular application of the principles described herein.

It will also be readily understood that although the present example illustrates a sleep transistor (110) in series between the Virtual_Vss node of the processor core (105) and Vss, in alternative embodiments, one or more sleep transistors (110) may be placed between a Virtual_Vdd node of the processor core (105) and the actual power supply (Vdd) to achieve the same functionality as that of the configuration shown in FIG. 1.

Figure 2:
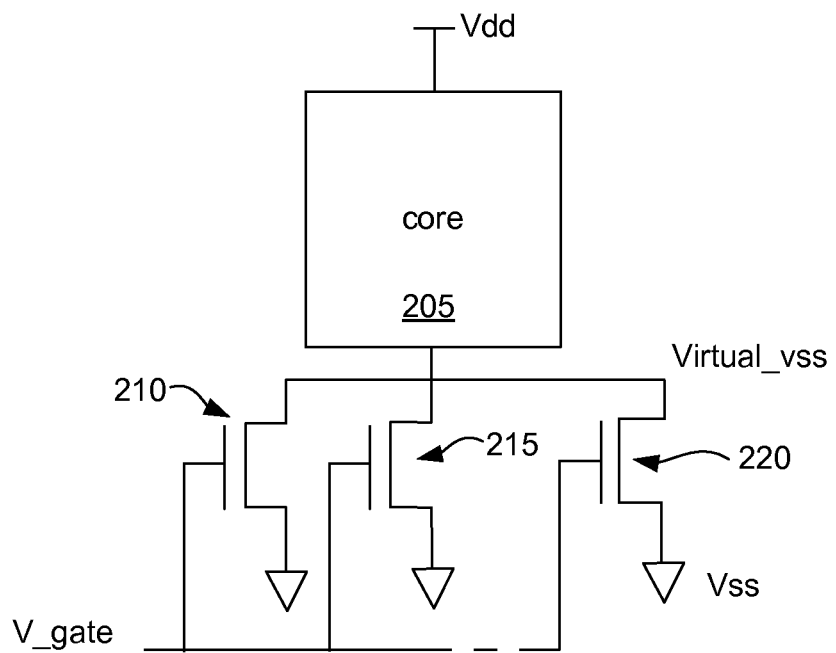
FIG. 2 is a block diagram of an illustrative power-gated processor core integrated circuit, according to one exemplary embodiment of the principles described herein.

Referring now to FIG. 2, a block diagram of another illustrative power-gated processor core (205) is shown. In the present example, a plurality of parallel sleep transistors (210, 215, 220) may be used to dynamically manage the power consumption of the processor core (205). Similar to the example of FIG. 1, the processor core (205) and the sleep transistors (210, 215, 225) may be implemented on separate dies. Moreover, the sleep transistors (210, 215, 225) may be, for example, vertical n-type power MOSFETs implemented in a die that is in a stacked configuration with the die of the processor core (205). Multiple parallel sleep transistors (210, 215, 220) may be used to provide a balance of current flow from the processor core (205) to Vss and to minimize localized heating of the processor core (205).

Figure 3:
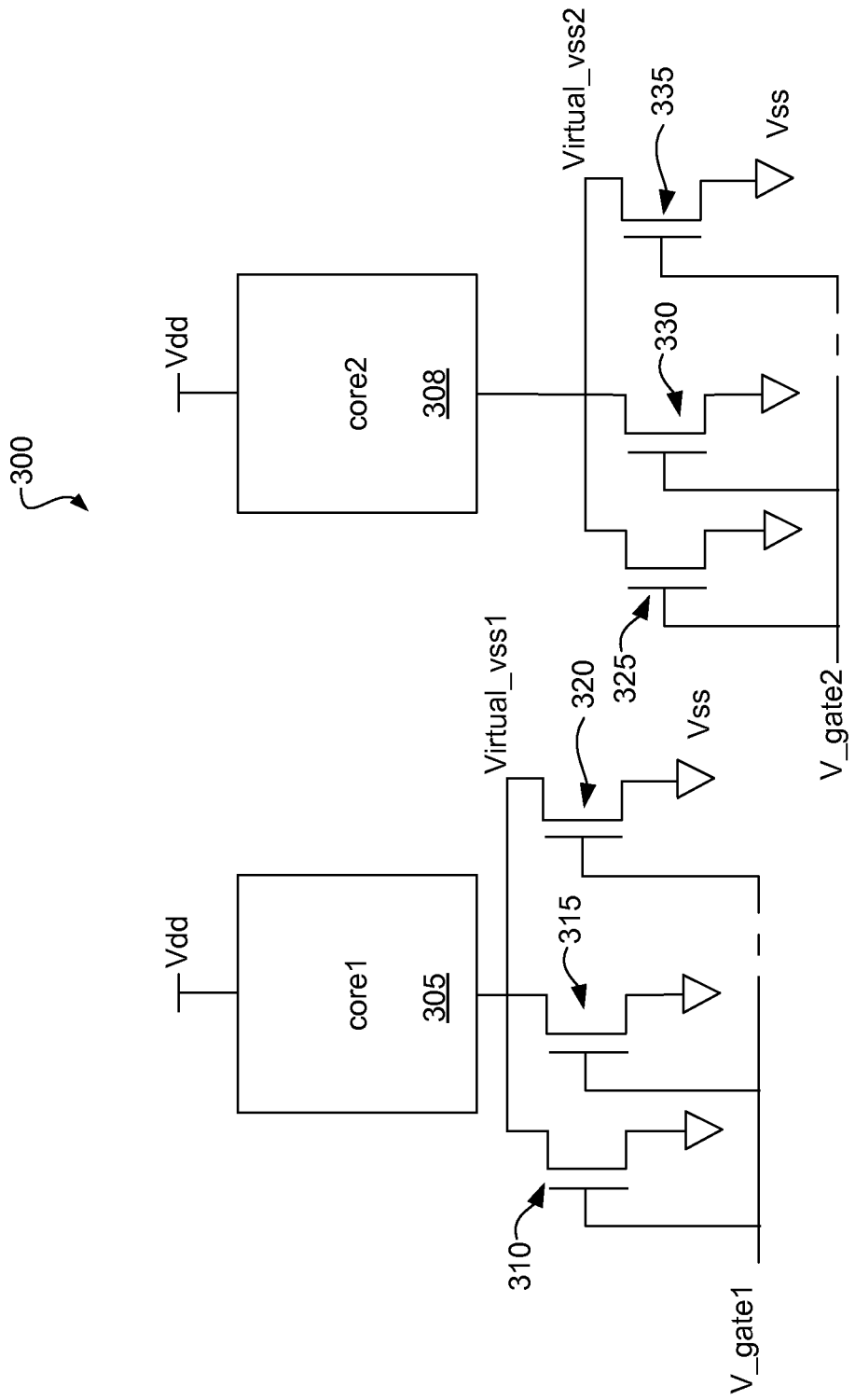
FIG. 3 is a block diagram of an illustrative power-gated multi-core processor integrated circuit, according to one exemplary embodiment of the principles described herein.

Referring now to FIG. 3, a block diagram of an electronic system (300) of multiple gated processor cores (305, 308) is shown. In the system (305, 308), first and second independent processor cores (305, 308, respectively) may be individually gated using independent control voltages (V_gate1, V_gate2). The V_gate1 control voltage may be provided to each of the gates of a first set of sleep transistors (310, 315, 320) in accordance with the above principles to manage power consumption of the first processor core (305). Similarly, the V_gate2 may be provided to each of the gates of a second set of sleep transistors (325, 330, 335) in accordance with the above principles to manage power consumption of the second processor core (308). Although only two processor cores (305, 308) are shown in the present example, any number of processor cores (305, 308) may be individually gated and controlled as may best suit a particular application of the principles described herein.

In certain embodiments, each of the processor cores (305, 308) may be implemented on a common chip. In such embodiments, each of the processor cores (305, 308) may be associated with a separate voltage supply plane on the chip to allow for the independent power gating of each processor core (305, 308). Alternatively, the processor cores (305, 308) may be implemented on separate chips that are supported on a common circuit board. In still other embodiments, the processor cores (305, 308) may be disposed on separate circuit boards within a system.

The power gating of the processor cores (305, 308) may be controlled dynamically, according to a measured or calculated utilization of the processor cores (305, 308). For example, if one of the processor cores (305) is substantially idle for a predetermined amount of time, power may be cut off from that processor core (305) using the sleep transistors (310, 315, 320) until the activity of the system (300) requires that power be restored to the processor core (305).

In certain embodiments, the control voltage for each of the processor cores (305, 308) may be provided by another of the processor cores (305, 308). In such embodiments, it may be necessary for at least one processor cores (305, 308) to be powered at all times. In other embodiments, the power gating of the processor cores (305, 308) may be performed by independent power management circuitry. The independent power management circuitry may be powered separately from the processor cores (305, 308) such that the power management circuitry will have power and function even if power is cut off from both processor cores (305, 308) using the sleep transistors (310, 315, 320, 325, 330, 335). For example, the power management circuitry may be coupled to an input/output (I/O) power plane.

Figure 4A:
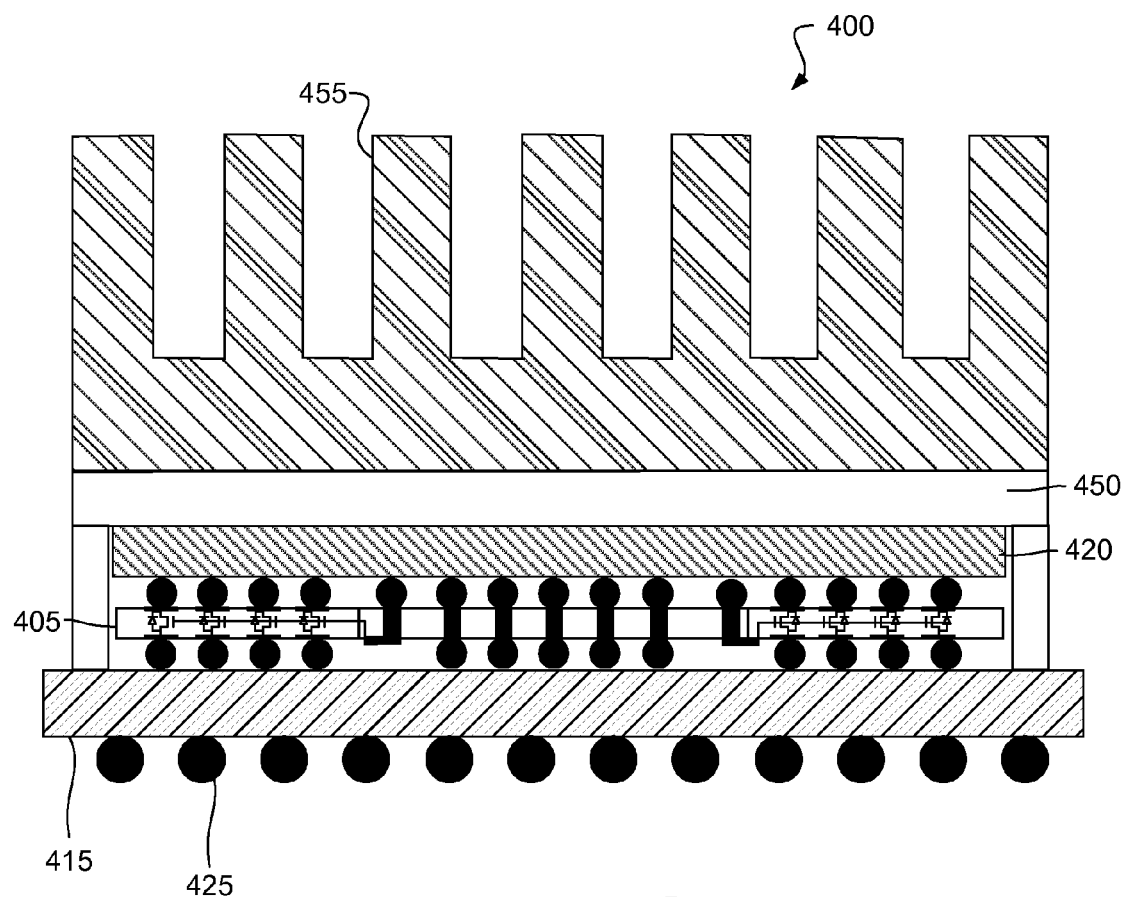
FIG. 4A is a cross-sectional diagram of an illustrative integrated circuit system of per-core power gating using stacked transistors, according to one exemplary embodiment of the principles described herein.
Figure 4B:
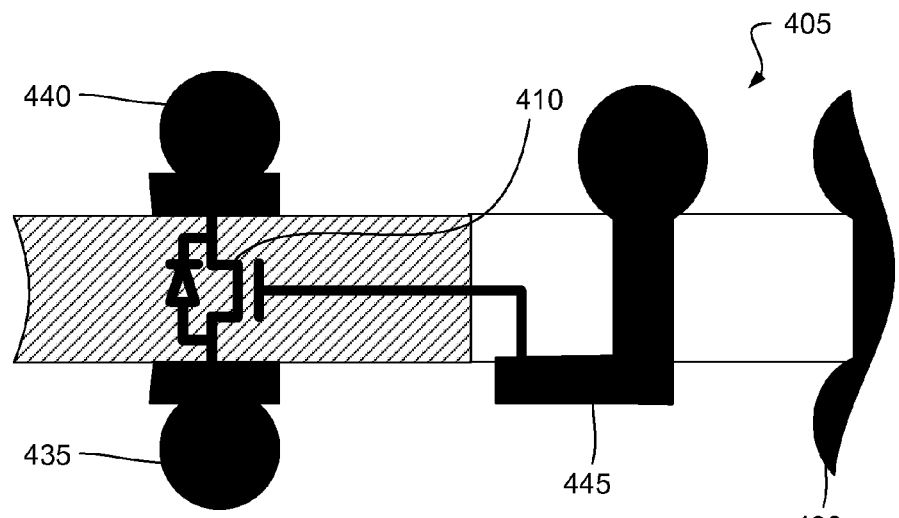
FIG. 4B is a cross-sectional diagram of a portion of an interposer die in a system of power gating using stacked transistors, according to one exemplary embodiment of the principles described herein.

Referring now to FIGS. 4A and 4B, cross-sectional diagrams of an illustrative integrated circuit package (400) having stacked power-gating circuitry are shown. FIG. 4A shows a side view of the entire integrated circuit package (400), while FIG. 4B shows a close-up view of an interposer die (405) in the integrated circuit package (400).

In the present example, power MOSFET technology is used to implement sleep transistors (410) on the interposer die (405). The interposer die (405) is thus a dedicated silicon die that is stacked between a package substrate (415) and a digital logic die (420). The processor die (420) may implement a processor system having a plurality of processor cores.

The MOSFET sleep transistors (410) may be vertically oriented, and fabricated in the interposer die (405) such that a drain node of each sleep transistor (410) can be communicatively coupled to a virtual Vss node and a source node of each sleep transistor (410) can be communicatively coupled to a Vss node. A parasitic diode inherent to MOSFET sleep transistors (410) is reverse biased between the drain and the source of the sleep transistors (410).

The interposer die (405) and the digital logic die (420) may communicate with exterior circuitry through a ball grid array (BGA) (425) disposed on the exterior of the integrated circuit package (400). These electrically conductive BGA bumps (425) may be communicatively coupled to a power supply and external digital circuitry through a PCB board that supports the integrated circuit package (400). Signals intended for the digital logic die (420) may be routed thereto using through silicon vias (TSVs) (430) disposed in the interposer die (405).

The source nodes of the sleep transistors (410) in the interposer die (405) may be communicatively coupled to Vss through conductive bumps (435) that are communicatively coupled to the package substrate (415) and thereby routed to an external Vss. The drain nodes of the sleep transistors (410) may be communicatively coupled to one or more Virtual_Vss nodes (as described above) of one or more processor cores implemented in the digital logic die (420). This coupling is made through conductive bumps (440) that are communicatively coupled to corresponding nodes in the digital logic die (420).

In the present embodiment, one or more control signals from the digital logic die (420) may be communicatively coupled to the gates of the sleep transistors (410) using TSVs (445). As has been discussed previously, these control signals may originate from separate processor cores implemented on the digital logic die or from independent power management circuitry implemented on the digital logic die (420).

A heat spreader (450) may be stacked above the digital logic die (420). This heat spreader (450) is configured to evenly distribute heat being dissipated by the digital logic die (420) across the area of the heat spreader (450). A heat sink (455) may be stacked on top of the heat spreader (450) and dissipate heat from the surface of the heat spreader (450) into the environment surrounding the integrated circuit package (400) to cool the digital logic die (420), and indirectly, the interposer die (405). The packaging material, package substrate (415), heat spreader (450), and heat sink (455) of the present integrated circuit package (400) may include any suitable materials that may best suit a particular application of the principles described herein.

The stacked power gating configuration of the integrated circuit apparatus (400) of the present example provides many benefits. For example, the on-package approach of power gating avoids the area overhead requirements of an on-die power gating solution for the digital logic die (420). Furthermore, the vertical nature of power MOSFET sleep transistors (410) simplifies their connection to the digital logic die (410) and the package substrate (415) in a stacked configuration. Moreover, as described above, vertical sleep transistors have inherent advantages in both resistance and current leakage as compared to lateral transistors.

Illustrative Systems

Figure 5:
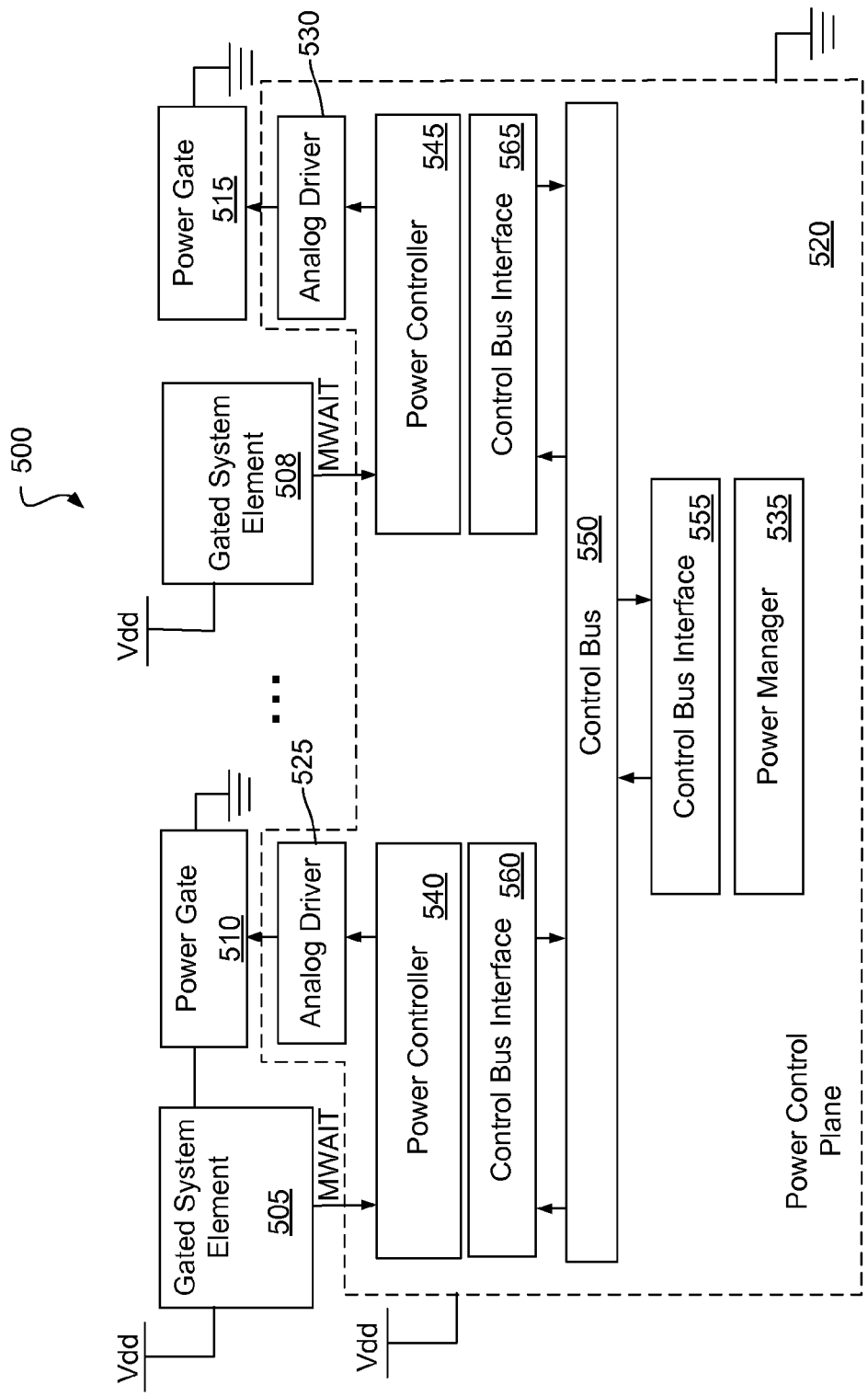
FIG. 5 is a block diagram of an illustrative architectural framework for a per-core power gating system using stacked transistors, according to one exemplary embodiment of the principles described herein.

Referring now to FIG. 5, a block diagram of an illustrative architectural framework for per-core power gating system (500) is shown. The system (500) may be implemented, for example, in the digital logic die (410, FIG. 4) and interposer die (405) described above. Again, it will be understood that while the present system (500) deals primarily with the individual power gating of independently powered processor cores, the power gating principles of the system (500) may be extended, and are applicable to all major blocks in a digital chip. For example, the power gating principles of the present example may be applied to, but are not limited to, processor cores, shared cache tiles, encrypt or protocol offloading engines, memory channels, and/or I/O channels.

The present system (500) includes a plurality of gated system elements (505, 508). In certain embodiments, the gated system elements (505, 508) may include one or more processor cores. Additionally or alternatively, the gated system elements (505, 508) may include cache tiles, network controllers, special purpose accelerators, memory controllers, and/or any other system element that may suit a particular application of the principles herein. Each of the gated system elements (505, 508) may be associated with an individual power gate (510, 515) that has one or more sleep transistors (410, FIG. 4). A power control plane (520) may be independently powered from the gated system elements (505, 508) and include analog drivers (525, 530) configured to control the power gates (510, 515) such that electrical power is selectively provided to or cut off from each gated system element (505, 508) to optimize power consumption of the system (500).

The power control plane (520) may also include a power manager (535) module that determines when each of the gated system elements (505, 508) will be provided with, or cut off from, power according to a power management algorithm. This algorithm may take into account measured utilization of the gated system elements (505, 508) and/or the system (500) as a whole, workload characteristics of the gated system elements (505, 508) and/or the system (500) as a whole, quality of service (QoS) requirements, or other requirements that may suit a particular application.

The power manager (535) may communicate with individual power controllers (540, 545), configured to control each analog driver (525, 530, respectively), through a control bus (550). The power controllers (540, 545) may make their corresponding power gates (510, 515) architecturally visible so that privileged software (e.g. firmware, hypervisor, or an operating system) can control the power gates (510, 515) through register or memory operations. Each of the power manager (535), and the power controllers (540, 545) may be associated with a control bus interface (555, 560, 565, respectively) to communicate with the control bus (550).

Each of the power manager (535), the power controllers (540, 545), the control bus (550), and the control bus interfaces (555, 560, 565) may be implemented in a variety of known ways, as may best suit a particular application. For example, the power controllers (540, 545) may be implemented as states or fields encoded in existing registers of advanced configuration and power interface (ACPI) hardware. By way of further example, the power manager (535) may be implemented as a periodic service running on one of the gated system elements (505, 508) or on a separate microcontroller. In certain embodiments, the control bus may be a stand-alone bus (e.g., similar to or derived from the I$^2$C protocol) or an existing system interconnect that provides access to memory-mapped registers.

In the present example, a gated system element (505, 508) may message its associated power controller (540, 545) through the use of a special instruction (MWAIT) or by writing to a memory-mapped register. This feature may allow each gated system element (505, 508) to have the final say in its own loss of power and ensure that an operating system running on one or more off the gated system elements (505, 508) has ample time to prepare for a gated system element (505, 508) to lose power.

In certain embodiments, the circuitry in the power control plane (520) may be connected to an uninterrupted power supply (UPS) that is not gated, to enable continuous operation of the control circuitry. For example, the power control plane (520) may be powered by an I/O power plane. Additionally, the digital circuits associated with the power control plane (520) may be relatively small and consume low amounts of power, such that their presence does not significantly impact the total power consumption of the system (500).

Illustrative Methods

Figure 6:
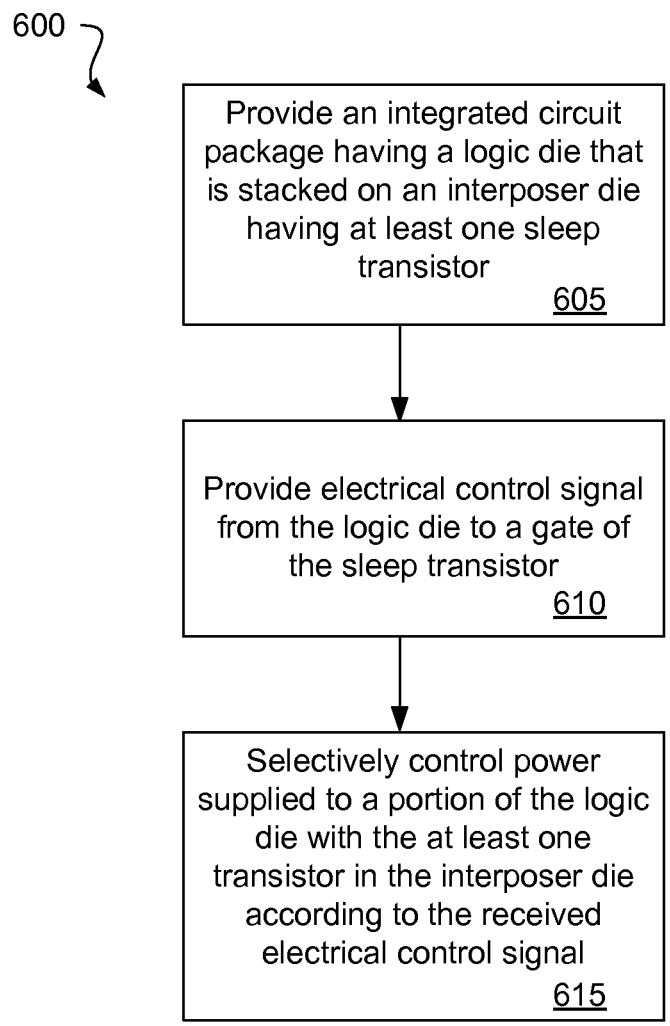
FIG. 6 is a flowchart diagram of an illustrative method of power management in an integrated circuit, according to one exemplary embodiment of the principles described herein.

Referring now to FIG. 6, an illustrative method (600) of power management in an integrated circuit system is shown. The method (600) may be applied, for example, to an integrated circuit package (400, FIG. 4) like that shown in FIG. 4.

The method (600) includes providing (step 605) an integrated circuit package having at least one sleep transistor, such as a vertical power MOSFET, in an interposer die that is stacked on a substrate and a logic die stacked on the interposer die. It will be appreciated by those skilled in the art, however, that the order of the logic die and interposer die in the stack may be reversed.

An electrical control signal is provided (step 610) from the logic die to a gate of the sleep transistor. The power supplied to a portion of the logic die is then selectively controlled (step 615) with the at least one sleep transistor according to the received electrical control signal.

The electrical control signal provided (step 610) to the gate of the sleep transistor from the logic die may be from one of a plurality of processing cores implemented by the logic die or from power management logic circuitry implemented by the logic die. In some embodiments, the control signal may be provided (step 610) to the gate of the sleep transistor using at least one electrically conductive bump disposed between the logic die and the interposer die.

EXAMPLE

Figure 7:
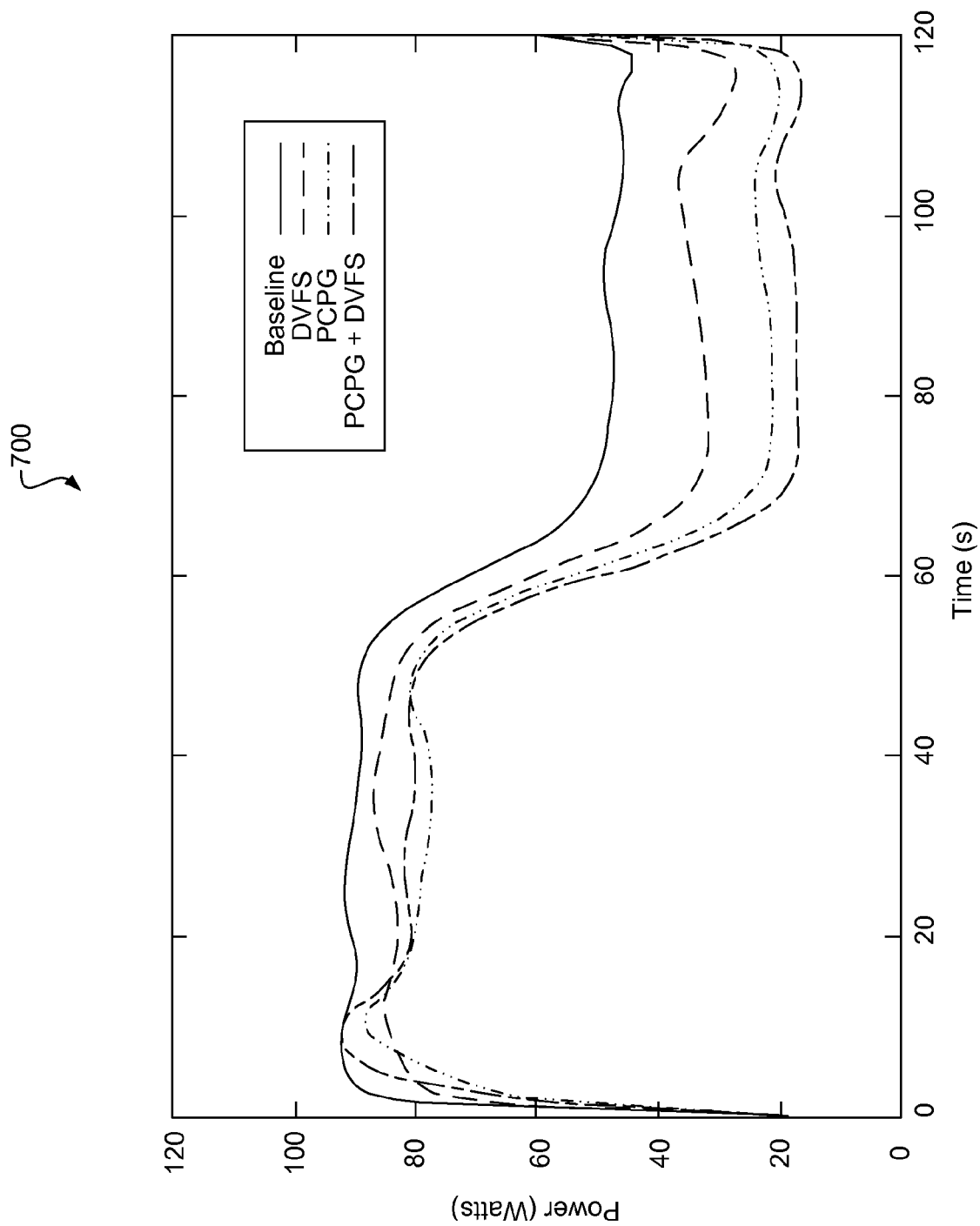
FIG. 7 is a diagram of comparative power consumption in identical systems employing a plurality of power consumption management schemes, according to one exemplary embodiment of the principles described herein.

Referring now to FIG. 7, a power consumption graph (700) is shown of a commercial multi-core web server under various power consumption management schemes. For each power management scheme tested, the server was given an identical workload. A baseline trace illustrates an expected power consumption of the web server without using any power consumption management scheme.

A dynamic voltage and frequency scaling (DVFS) trace illustrates the power consumption savings attributable to techniques currently available in the art.

A per-core power gating (PCPG) trace illustrates the power consumption of the web server under the power management scheme disclosed in the present specification. As can be seen, substantial power consumption savings were achieved over both the baseline and the DVFS examples using the principles of the present specification.

A combination of per-core power gating and dynamic frequency and voltage scaling (PCPG+DVFS) achieved the lowest power consumption, but was only a slight improvement over the per-core power gating scheme taken alone.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An integrated circuit system comprising:
    an interposer die comprising a plurality of sleep transistors; and
    a digital logic die stacked vertically with said interposer die, wherein said digital logic die comprises;
    a plurality of gated system elements, wherein a power supply to each of said gated system elements is independently gated by at least one of said sleep transistors in said interposer die, and
    a power manager module configured to selectively control said sleep transistors to selectively provide power to individual said gated system elements to manage power consumption in said system.

2. The system of claim 1, wherein each said gated system element comprises a separate power plane within said digital logic die.

3. The system of claim 1, wherein at least one control voltage (V_gate, V_gate1, V_gate2) at said sleep transistors is selectively controlled by a register value written by said power manager module.

4. The system of claim 1, wherein said power manager module is configured to determine an optimal number of active gated system elements according to at least one of: measured utilization of the gated system elements, workload characteristics of the gated system elements, workload characteristics of the system, a measured utilization of the system, and predetermined quality of service requirements.

5. The system of claim 1, wherein said sleep transistors comprise vertical n-type metal oxide semiconductor field effect transistors (MOSFETs).

* * * * *